(12) United States Patent
Yi et al.

(10) Patent No.: US 11,490,544 B2
(45) Date of Patent: Nov. 1, 2022

(54) METHOD OF FIXING FLEXIBLE PRINTED CIRCUIT AND MOBILE TERMINAL

(71) Applicant: VIVO MOBILE COMMUNICATION CO., LTD., Chang'an Dongguan (CN)

(72) Inventors: Xiaojun Yi, Chang'an Dongguan (CN); Shiwen Xiao, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 0 days.

(21) Appl. No.: 16/641,953

(22) PCT Filed: Jul. 23, 2018

(86) PCT No.: PCT/CN2018/096651
§ 371 (c)(1),
(2) Date: Feb. 25, 2020

(87) PCT Pub. No.: WO2019/037565
PCT Pub. Date: Feb. 28, 2019

(65) Prior Publication Data
US 2020/0245495 A1 Jul. 30, 2020

(30) Foreign Application Priority Data
Aug. 25, 2017 (CN) .......................... 201710742635.2

(51) Int. Cl.
*H05K 1/02* (2006.01)
*H05K 7/20* (2006.01)
(Continued)

(52) U.S. Cl.
CPC ......... *H05K 7/2039* (2013.01); *H05K 1/0277* (2013.01); *H05K 1/09* (2013.01);
(Continued)

(58) Field of Classification Search
CPC ...... H05K 7/2039; H05K 1/0277; H05K 1/09; H05K 1/11; H05K 5/0086; H05K 5/03; H05K 7/1427; H05K 2201/10356
(Continued)

(56) References Cited

U.S. PATENT DOCUMENTS 8,625,305 B2 * 1/2014 Hisada ................ H04M 1/0249
361/810
2008/0132284 A1 * 6/2008 Ryu .................. H04M 1/72403
455/566
(Continued)

FOREIGN PATENT DOCUMENTS

| CN | 204013634 U | 12/2014 |
|---|---|---|
| CN | 204481120 U | 7/2015 |

(Continued)

OTHER PUBLICATIONS

Chinese First Office Action Application No. 201710742635.2; dated Sep. 27, 2018.
(Continued)

*Primary Examiner* — Sherman Ng
(74) *Attorney, Agent, or Firm* — von Briesen & Roper, s.c.

(57) ABSTRACT

A method of fixing a flexible printed circuit (FPC) and a mobile terminal are provided. The mobile terminal includes: a rear cover; a first FPC fixedly connected to the rear cover; a front housing provided with a battery accommodation compartment; in case that a battery is installed in the battery accommodation compartment, there is a gap between the battery and the first FPC.

9 Claims, 3 Drawing Sheets

(51) Int. Cl.
  *H05K 1/09* (2006.01)
  *H05K 1/11* (2006.01)
  *H05K 5/00* (2006.01)
  *H05K 5/03* (2006.01)
  *H05K 7/14* (2006.01)

(52) U.S. Cl.
  CPC ............ *H05K 1/11* (2013.01); *H05K 5/0086* (2013.01); *H05K 5/03* (2013.01); *H05K 7/1427* (2013.01); *H05K 2201/10356* (2013.01)

(58) Field of Classification Search
  USPC ......................................................... 361/749
  See application file for complete search history.

(56) References Cited

U.S. PATENT DOCUMENTS

| | | | |
|---|---|---|---|
| 2010/0072952 A1 | 3/2010 | Nakajima | |
| 2010/0091439 A1* | 4/2010 | Horii | H04M 1/0249 361/679.01 |
| 2011/0230146 A1* | 9/2011 | Morishita | H01Q 1/243 455/77 |
| 2011/0234460 A1* | 9/2011 | Hiraoka | H01Q 9/28 343/702 |
| 2012/0034957 A1* | 2/2012 | Kim | H04M 1/0262 455/572 |
| 2012/0268879 A1* | 10/2012 | Kim | H05K 1/147 361/679.09 |
| 2012/0329526 A1* | 12/2012 | Song | H04M 1/0266 455/566 |
| 2013/0114195 A1* | 5/2013 | Lee | H01H 13/83 361/679.01 |
| 2013/0176179 A1* | 7/2013 | Park | H02J 7/0045 343/702 |
| 2014/0159657 A1* | 6/2014 | Kim | H01Q 1/243 320/108 |
| 2014/0342191 A1* | 11/2014 | Shin | H01M 10/486 429/7 |
| 2015/0326054 A1* | 11/2015 | Park | H02J 7/0042 455/573 |
| 2016/0164062 A1* | 6/2016 | Liu | H01M 50/20 429/121 |
| 2016/0285494 A1* | 9/2016 | Lombardi | H04B 1/3883 |
| 2017/0097610 A1* | 4/2017 | Matsunaga | G04B 37/1486 |

FOREIGN PATENT DOCUMENTS

| | | |
|---|---|---|
| CN | 204761068 U | 11/2015 |
| CN | 205040090 U | 2/2016 |
| CN | 105810862 A | 7/2016 |
| CN | 106790802 A | 5/2017 |
| CN | 107509352 A | 12/2017 |

OTHER PUBLICATIONS

Chinese Search Report Application No. 201710742635.2; dated May 22, 2018.
International Search Report & Written Opinion related to Application No. PCT/CN2018/096651; dated Oct. 11, 2018.

* cited by examiner

METHOD OF FIXING FLEXIBLE PRINTED CIRCUIT AND MOBILE TERMINAL

CROSS-REFERENCE TO RELATED APPLICATION

This present application is a U.S. national phase application of a PCT Application No. PCT/CN2018/1096651 filed on Jul. 23, 2018, which claims a priority to Chinese Patent Application No. 201710742635.2, filed in China on Aug. 25, 2017, the disclosure of which is incorporated herein by reference in its entirety.

TECHNICAL FIELD

The present disclosure relates to the field of charging technology, in particular to a method of fixing a flexible printed circuit (FPC) and a mobile terminal.

BACKGROUND

In the related art, in order to achieve charging of a battery, an FPC is generally used inside a mobile terminal to make a connection. Specifically, as shown in FIG. 1, the mobile terminal includes a first FPC 2 and a front housing 3. In case that a battery 4 is installed in the mobile terminal, the first FPC 2 is sandwiched between the front housing 3 and the battery 4. When the battery 4 is charged by using a charging circuit including the first FPC 2, especially when the battery 4 being charged with a high current, because the front housing 3 hinders the first FPC 2 from dissipating heat, the heat generated by the first FPC 2 and the heat generated by the battery 4 are likely to give rise to a superimposed temperature rise effect. Thus, the temperature rise effect inside the mobile terminal is very significant, which seriously impacts the charging efficiency and the charging safety of the mobile terminal.

SUMMARY

In a first aspect, an embodiment of the present disclosure provides a mobile terminal, including: a rear cover; a first flexible printed circuit (FPC), fixedly connected to the rear cover; a front housing, provided with a battery accommodation compartment, where in case that a battery is installed in the battery accommodation compartment, there is a gap between the battery and the first FPC.

In a second aspect, an embodiment of the present disclosure provides a method of fixing an FPC, applied to a mobile terminal, including: obtaining the FPC; fixedly connecting the FPC to a rear cover of the mobile terminal, where a front housing of the mobile terminal is provided with a battery accommodation compartment, in case that a battery is installed in the battery accommodation compartment, there is a gap between the battery and the FPC.

BRIEF DESCRIPTION OF THE DRAWINGS

In order to more clearly illustrate the technical solutions of the embodiments of the present disclosure, the drawings to be used in the description of the embodiments of the present disclosure will be described briefly below. Obviously, the drawings in the following description are merely some embodiments of the present disclosure. For those with ordinary skill in the art, other drawings can also be obtained on the basis of these drawings without creative efforts.

DETAILED DESCRIPTION

The technical solutions of the embodiments of the present disclosure will be clearly and completely described below in conjunction with the drawings of the embodiments of the present disclosure. It is apparent that the described embodiments are a part of the embodiments of the present disclosure, and not all of them. All other embodiments obtained based on the embodiments of the present disclosure by those skilled in the art fall within the scope of the disclosure.

In order to solve the problems in the related art, a method of fixing a flexible printed circuit (FPC) and a mobile terminal are provided by some embodiments of the present disclosure.

The mobile terminal provided by an embodiment of the present disclosure is described first below.

It should be noted that, the mobile terminal provided by an embodiment of the present disclosure may be any device having a communication function, such as a mobile phone, a tablet personal computer, a laptop computer, a personal digital assistant (PDA), a mobile Internet device (MID), or a wearable device.

Figure 1:
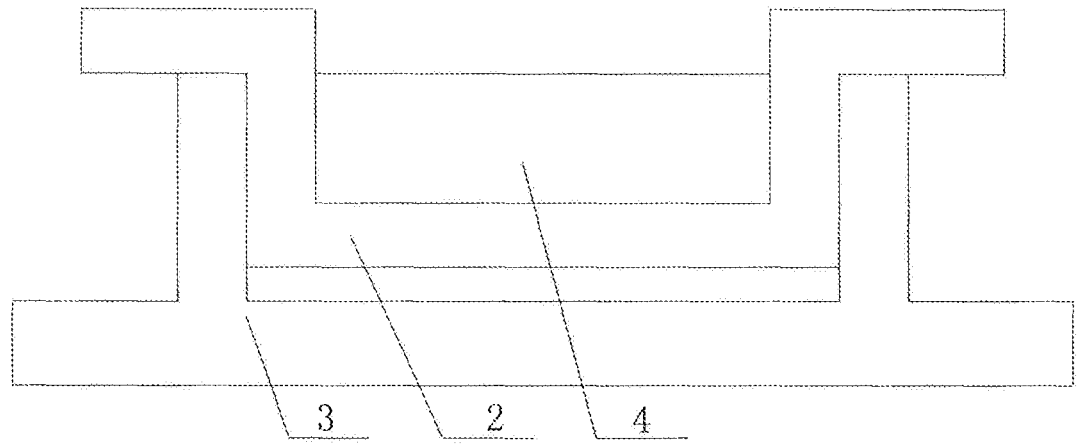
FIG. 1 is a schematic structural view of a mobile terminal provided in the related art.
Figure 2:
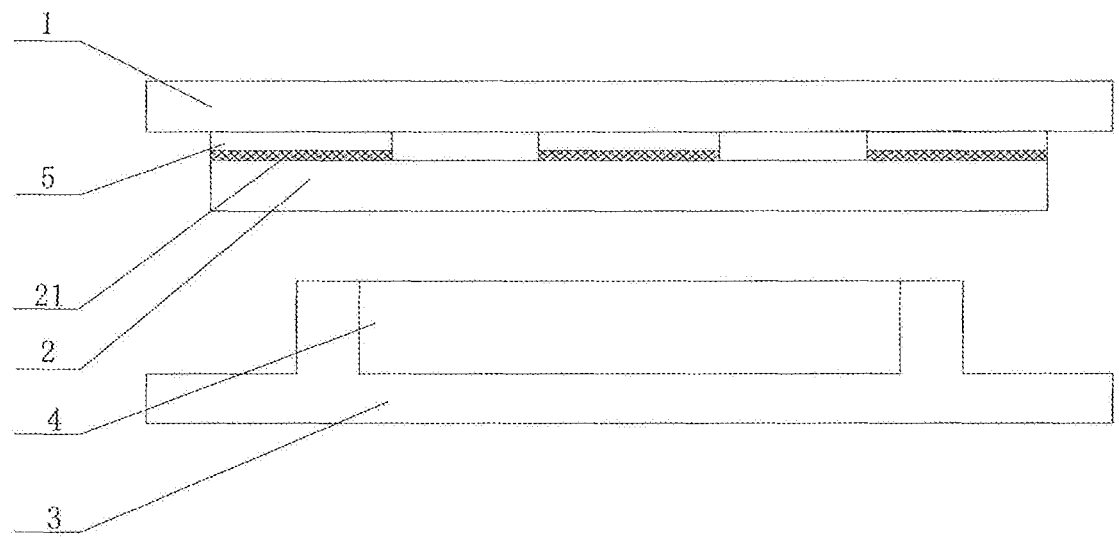
FIG. 2 is a schematic structural view of a mobile terminal according to an embodiment of the present disclosure.

Referring to FIG. 2, a schematic structural view of the mobile terminal according to an embodiment of the present disclosure is illustrated. As shown in FIG. 2, the mobile terminal includes a rear cover 1, a first FPC 2 and a front housing 3.

The first FPC 2 is fixedly connected to the rear cover 1.

Specifically, the first FPC 2 and the rear cover 1 may be fixedly connected by means of screwing, welding or riveting. Of course, an implementation of the fixed connection of the first FPC 2 and the rear cover 1 is not limited thereto, and may be specifically determined according to an actual condition, which is not limited in the embodiments of the present disclosure. In addition, as shown in FIG. 2, when the first FPC 2 is fixedly connected to the rear cover 1, the first FPC 2 and the rear cover 1 may be arranged in parallel.

Optionally, the rear cover 1 may be made of a metal material. Specifically, the rear cover 1 may be made of a copper material. Of course, the rear cover 1 may also be made of other metal materials such as an aluminum material, which are not enumerated here exhaustively.

The front housing 3 is provided with a battery accommodation compartment. When a battery 4 is installed in the battery accommodation compartment, there is a gap between the battery 4 and the first FPC 2.

A shape of the battery 4 and a shape of the battery installation compartment may conform to each other. Specifically, the battery 4 may be a rectangular parallelepiped structure, and the battery installation compartment may be a rectangular slot. Thus, the battery 4 having the rectangular parallelepiped structure can be reliably installed in the battery installation compartment. Optionally, after the battery 4 having the rectangular parallelepiped structure is installed in the battery installation compartment, the battery 4 and the front housing 3 may be fixedly connected by means of screwing or the like to further ensure a reliable installation of the battery 4.

In some embodiments of the present disclosure, the first FPC 2 is fixedly connected to the rear cover 1. When the battery 4 is installed in the battery accommodating compartment provided in the front housing 3, there is a gap between the battery 4 and the first FPC 2, and the first FPC 2 is not sandwiched between the front housing 3 and the battery 4. When the battery 4 is charged by using a charging circuit including the first FPC 2, heat generated by the first FPC 2 can be dissipated through the gap between the battery 4 and the first FPC 2. The front housing 3 cannot hinder the first FPC 2 from dissipating heat. A superimposed temperature rise effect due to heat generated by the first FPC 2 and heat generated by the battery 4 is greatly alleviated. Thus, a temperature rise inside the mobile terminal can be effectively reduced, thereby ensuring the charging efficiency and the charging safety of the mobile terminal.

Figure 3:
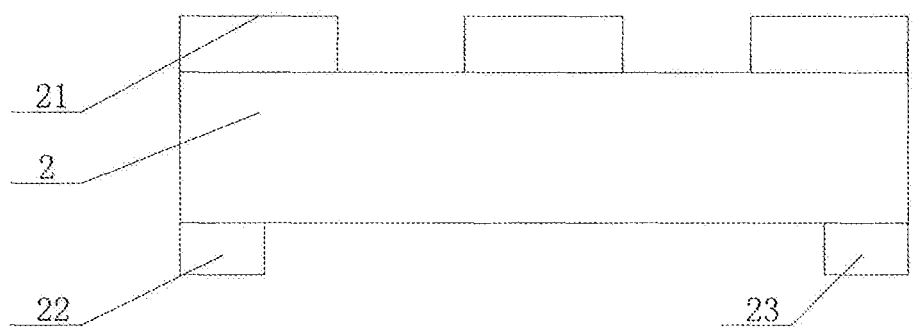
FIG. 3 is a schematic structural view, from a first perspective of view, of a first FPC of a mobile terminal according to an embodiment of the present disclosure.
Figure 5:
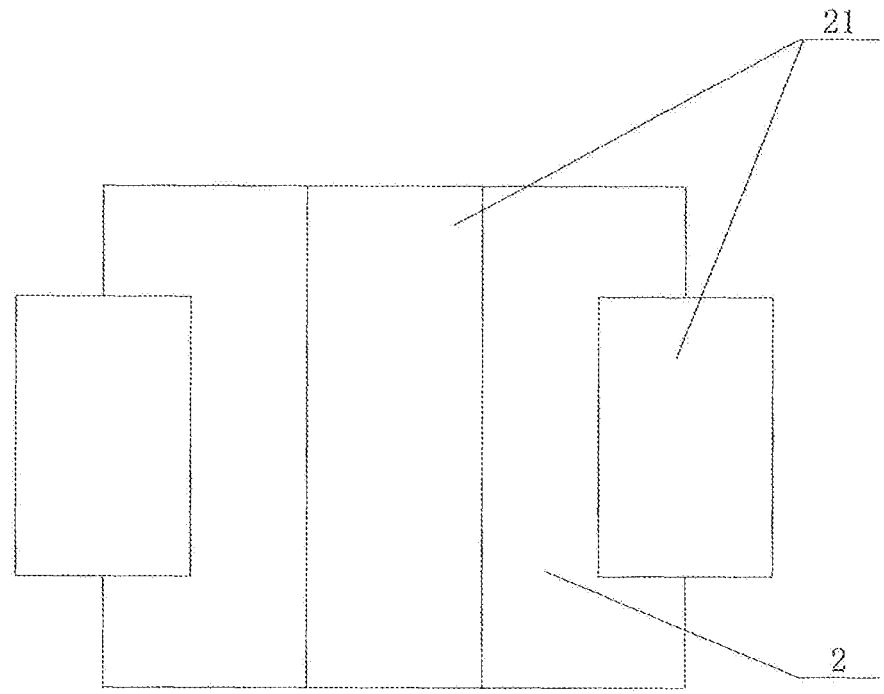
FIG. 5 is a schematic structural view, from a third perspective of view, of a first FPC of a mobile terminal according to an embodiment of the present disclosure.

Optionally, the first FPC 2 is provided with a grounded gold surface 21 as shown in FIG. 2, FIG. 3 and FIG. 5. The grounded gold surface 21 and the rear cover 1 are fixedly connected by an electrically conductive and thermally conductive material 5.

The grounded gold surface 21 and the rear cover 1 can be welded or bonded to each other by the electrically conductive and thermally conductive material 5.

Specific implementations of welding the grounded gold surface 21 and the rear cover 1 by the electrically conductive and thermally conductive material 5 are described by way of example below.

In a specific implementation, the electrically conductive and thermally conductive material 5 may be a tin paste, and the grounded gold surface 21 and the rear cover 1 are welded by using the tin paste. In this implementation, a surface mount technology (SMT) is generally used to weld the grounded gold surface 21 provided on the first FPC 2 to the rear cover 1 made of the metal material. The specific process flow is: printing tin paste→FPC mounting→reflow welding.

The step of printing tin paste refers to that the tin paste is printed on the rear cover 1 by using a scraper at a 45 degree angle, to prepare for welding. Equipment used in the operation is a printing machine (specifically a tin paste printing machine) located at the forefront of a SMT production line.

The FPC mounting refers to accurately mounting the grounded gold surface 21 provided on the first FPC 2 to a fixation position on the rear cover 1. Equipment used in the operation is a mounter located behind the printing machine in the SMT production line (generally, a high-speed mounter and a universal mounter are used in combination in accordance with production needs).

The reflow welding refers to melting the tin paste, and using the melted tin paste to firmly weld the grounded gold surface 21 arranged on the first FPC 2 and the rear cover 1 together. Equipment used in the operation is a reflow furnace located behind the mounter in the SMT production line (the reflow furnace has strict temperature requirements and a real-time temperature measurement is required).

Specific implementations of bonding the grounded gold surface 21 and the rear cover 1 by using the electrically conductive and thermally conductive material 5 are described by way of example below.

In a specific implementation, the electrically conductive and thermally conductive material 5 may be an electrically conductive and thermally conductive adhesive, which may be prepared from an epoxy resin loaded with electrically conductive and thermally conductive particles such as aluminum powder. Thus, an operator only needs to stack the rear cover 1, the electrically conductive and thermally conductive adhesive and the first FPC 2 in order, and then put them into a press to undergo a hot pressing, to achieve the bonding of the grounded gold surface 21 and the rear cover 1 by using the electrically conductive and thermally conductive adhesive.

It should be noted that, the press may be a vacuum press, a quick press or a conventional press. A heating temperature of the press can be 100° C.-200° C. A heating pressure may be 20 Kg-30 Kg. A heating duration can be 30 min-45 min. Of course, parameters such as the heating temperature, the heating pressure and the heating duration can also be adjusted according to an actual condition.

In some embodiments of the present disclosure, a grounded gold surface 21 provided on the first FPC 2 and the rear cover 1 are fixedly connected by the electrically conductive and thermally conductive material 5. Since the electrically conductive and thermally conductive material 5 conducts heat, when the battery 4 is charged by using the charging circuit including the first FPC 2, the heat generated by the first FPC 2 can be conducted to the rear cover 1 through the electrically conductive and thermally conductive material 5. Since the rear cover 1 is made of the metal material, and a thermal conductivity of the metal material is generally good, the heat conducted to the rear cover 1 can be dissipated timely, which facilitates the heat dissipation of the first FPC 2 to reduce the temperature rise of the first FPC 2 and the temperature rise inside the entire mobile terminal. In addition, because the electrically conductive and thermally conductive material 5 is electrically conductive, the first FPC 2 is grounded in effect, which can effectively improve concerns regarding electro magnetic interference (EMI)/electro magnetic compatibility (EMC).

Optionally, the first FPC 2 is provided with the grounded gold surface 21 as shown in FIG. 2, FIG. 3 and FIG. 5. The grounded gold surface 21 and the rear cover 1 are welded by means of an ultrasonic metal welding.

It can be understood by those skilled in the art that, the ultrasonic metal welding refers to transmitting high-frequency oscillating waves generated by an ultrasonic welding machine to surfaces of two workpieces to be welded, and using a welding head to apply a certain pressure to the workpieces to be welded, so that atoms in the surfaces of the two workpieces to be welded are excited and activated due to a high-frequency vibration friction, and the atoms in the surfaces of the workpieces to be welded are bonded to each other to form a welding joint. Generally speaking, the ultrasonic metal welding has advantages such as a smooth welding joint, a low requirement on welding surface and a fast welding speed.

In some embodiments of the present disclosure, the grounded gold surface 21 provided on the first FPC 2 and the rear cover 1 are fixedly connected by the ultrasonic metal welding. Then, the grounded gold surface 21 is in direct contact with the rear cover 1. When the battery 4 is charged by using the charging circuit including the first FPC 2, the heat generated by the first FPC 2 can be directly conducted to the rear cover 1. Since the rear cover 1 is made of a metal material, and a heat conductivity of the metal material is generally good, the heat conducted to the rear cover 1 can be dissipated timely, which facilitates the heat dissipation of the first FPC 2 to reduce the temperature rise of the first FPC 2 and the temperature rise inside the entire mobile terminal. In addition, because the grounded gold surface 21 is also made of a metal material, the first FPC 2 is grounded in effect, which can effectively improve concerns regarding EMI/EMC.

Figure 4:
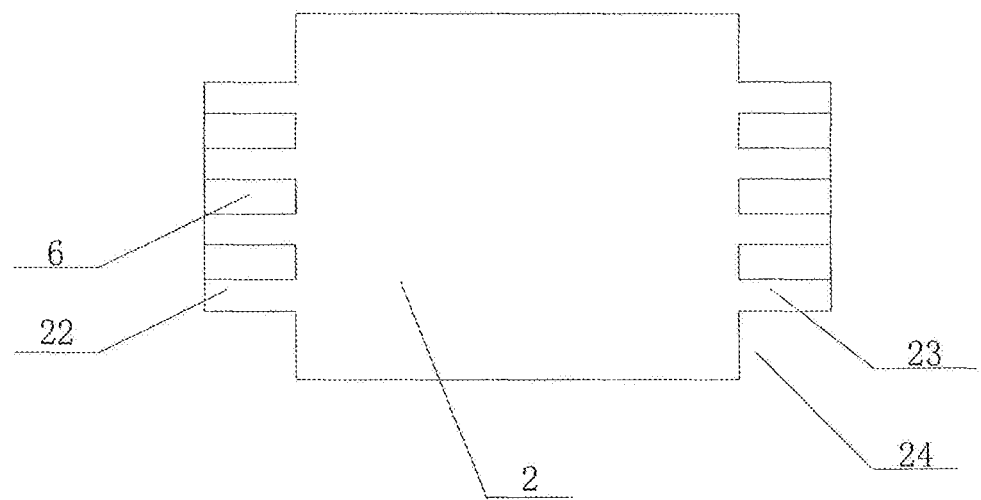
FIG. 4 is a schematic structural view, from a second perspective of view, of a first FPC of a mobile terminal according to an embodiment of the present disclosure.

Optionally, the mobile terminal further includes: a second FPC (not shown in the figures). As shown in FIG. 3 to FIG. 4, the first FPC 2 is provided with a first connection portion 22 and a second connection portion 23; the first connection portion 22 is configured to be electrically connected to a charging cable; the second connection portion 23 is electrically connected to a motherboard of the mobile terminal. The second FPC is provided with a third connection portion and a fourth connection portion, the third connection portion is electrically connected to the motherboard, and the fourth connection portion is configured to be electrically connected to the battery 4.

It should be noted that, there are a variety of specific implementations of the electrical connection between the first connection portion 22 and the charging cable. Two implementations are described by way of example below.

In a first implementation, the first connection portion 22 and the charging cable are electrically connected by a metal elastic piece and an elastic-piece-contact goldfinger 6 which fit with each other; one of the metal elastic piece and the elastic-piece-contact goldfinger 6 is arranged on the first connection portion 22, and the other is arranged on the charging cable. Specifically, as shown in FIG. 4, the elastic-piece-contact goldfinger 6 can be arranged on the first connection portion 22 and the metal elastic piece is arranged on the charging cable; both the number of the elastic-piece-contact goldfingers 6 and the number of the metal elastic pieces can be two, three or more (the specific number can be determined based on an actual condition).

In a second implementation, the first connection portion 22 and the charging cable are connected by a board-to-board (BTB) connector. One of the male end and female end of the BTB connector is provided on the first connection portion 22 and the other is provided on the charging cable.

It can be understood that, by comparison between the above two implementations, the first implementation is more conducive to the heat dissipation of the first FPC 2.

It should be noted that, for specific implementations of the electrical connection between the second connection portion 23 and the motherboard, specific implementations of the electrical connection between the third connection portion and the motherboard, and specific implementations of the electrical connection between the fourth connection portion and the battery 4, a reference may be made to the aforementioned two implementations of the electrical connection between the first connection part 22 and the charging cable, which are not repeated here exhaustively.

In some embodiments of the present disclosure, the charging cable, the first FPC 2, the motherboard, the second FPC and the battery 4 are connected in order to form the charging circuit. Thus, as long as the charging cable is connected to an external power source, the current from the external power source can flow to the battery 4 through the charging cable, the first FPC 2, the motherboard, and the second FPC in order, thereby supplying power to the battery 4 and achieving charging of the battery 4.

Optionally, as shown in FIG. 4, the first FPC 2 is provided with an interference avoidance structure 24 configured to avoid interference with the motherboard. The interference avoidance structure may be arranged on an edge of the first FPC 2. In a specific implementation, the interference avoidance structure 24 is provided at four corners of the first FPC 2. It can be seen that the interference avoidance structure 24 includes recesses provided at the four corners of the first FPC 2.

It can be understood that many components need to be mount on the motherboard of the mobile terminal. By providing the interference avoidance structure 24 on the first FPC 2, the first FPC 2 can be kept clear of these components, so as to facilitate mounting and fixing these components and the first FPC 2.

Optionally, the battery 4 is a graphene battery.

It should be noted that, owing to the characteristics of large amount of lithium ions moving rapidly between a graphene surface and an electrode, a charging time of several hours may be reduced to less than 1 minute in the graphene battery. Thus, the mobile terminal can provide a better user experience to users. In addition, a volume of the graphene battery is only 50% of a volume of the lithium ion battery, that is, the volume of the battery 4 can be effectively reduced.

It should be noted that, an area of the first FPC 2 should be within a proper range in above embodiments, since, on one hand, it is necessary to ensure that the first FPC 2 has good overcurrent and heat dissipation capabilities as far as possible, on the other hand, it is necessary to reduce a production cost of the first FPC 2 as much as possible.

In addition, specifically, a process flow of a manufacturing process of the first FPC 2 and the second FPC is: cutting→drilling→shadowing→copper plating→wire etching→cover layer→surface treatment→punching→bare board electrical test→bare board inspection→SMT mounting→second punching→finished product test.

The drilling refers to drilling holes in a product that can connect two or more layers of the product by using a drilling machine. The holes serve as a foundation and a link for connecting the layers.

The shadowing refers to forming an electrically conductive carbon film on a hole wall after drilling, so that the hole wall can be plated with copper during the copper plating. Generally speaking, the hole wall after drilling is negatively charged, after a hole conditioning process of the shadowing, the hole wall is positively charged. The graphite suspension in a conductive colloid tank is negatively charged, so it can be attracted by the positive charges on the hole wall, thereby graphite is adsorbed on the hole wall.

The electroplating refers to depositing a layer of copper meeting thickness requirements on the hole wall or the entire surface of the product through electroplating, so that each layer is conductive, to provide sufficient electrical conductivity.

The wire etching refers to forming the wires required for the design by using a series of processes such as exposure, development and etching.

The cover layer refers to a process of bonding a protective film to the FPC.

The surface treatment refers to the use of organic solderability preservatives (OSP) and nickel-gold plating. The grounded gold surface is generally formed by using an electroless nickel/immersion gold process (i.e., ENIG, which is a process of chemically depositing a layer of nickel-gold on a specified bonding pad of the product). The thickness of the electroless deposited nickel is generally controlled at 3 um-6 um, which can not only protect the copper surface, but also prevent copper migration. The thickness of gold is generally 0.03 um-0.1 um, which not only protects the nickel layer to prevent the nickel layer from oxidizing, but also offers good contact conductivity.

The punching refers to a process of removing the non-product portion (that is, a useless frame on the periphery) to obtain the product with a desired size. There are generally three types of punching, namely, mould punching, laser cutting and computerized numerical control (CNC) forming.

The electrical test refers to a charging performance test, and the charging performance test includes a conductivity test and an insulation test.

The SMT mounting refers to directly adhering or bonding chips of miniaturized leadless or short-lead surface mount components/devices to specified positions on the surface of a printed circuit board (PCB) or other substrate by using automatic assembly equipment.

The electrical test of the finished product includes a conductivity test and a function test. The test modes are different depending on the devices mounted onto the product.

In summary, the temperature rise inside the mobile terminal can be effectively reduced according to the embodiments of the present disclosure, thereby ensuring the charging efficiency and the charging safety of the mobile terminal.

The method of fixing an FPC provided by an embodiment of the present disclosure is described below.

The method of fixing an FPC provided by an embodiment of the present disclosure is applied to a mobile terminal.

Figure 6:
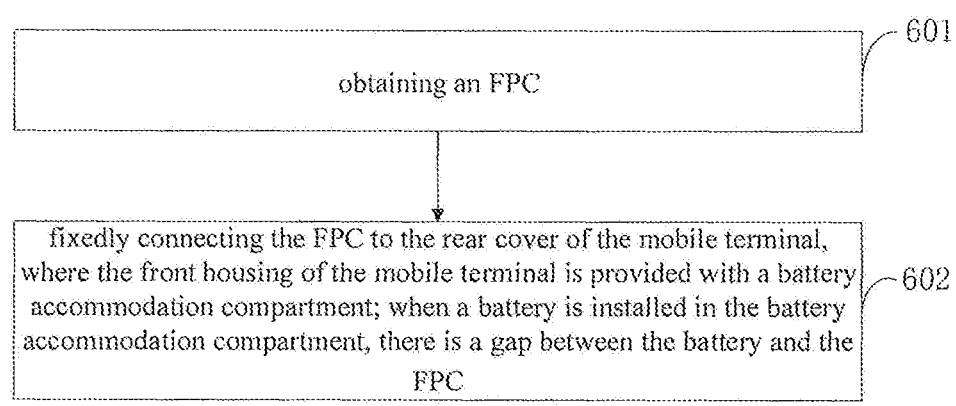
FIG. 6 is a flowchart of a method of fixing an FPC according to an embodiment of the present disclosure.

Referring to FIG. 6, a flowchart of the method of fixing an FPC according to an embodiment of the present disclosure is illustrated. As shown in FIG. 6, the method includes following steps.

A step 601 includes: obtaining an FPC.

For the manufacturing process of the FPC, a reference may be made specifically to the introduction of the preparation process of the first FPC and the second FPC in the above embodiments of the mobile terminal, and details thereof are not described herein again.

A step 602 includes: fixedly connecting the FPC to the rear cover of the mobile terminal, where the front housing of the mobile terminal is provided with a battery accommodation compartment; when a battery is installed in the battery accommodation compartment, there is a gap between the battery and the FPC.

Optionally, the rear cover is made of a metal material.

Optionally, the FPC is provided with a grounded gold surface; and the fixedly connecting the FPC to the rear cover of the mobile terminal includes: fixedly connecting the grounded gold surface to the rear cover of the mobile terminal with an electrically conductive and thermally conductive material; or, fixedly connecting the grounded gold surface to the rear cover of the mobile terminal by means of an ultrasonic metal welding.

It should be noted that, the FPC in the embodiments of the present disclosure is specifically the first FPC of the mobile terminal in the foregoing embodiments.

In some embodiments of the present disclosure, as shown in FIG. 2, the first FPC 2 is fixedly connected to the rear cover 1. When the battery 4 is installed in the battery accommodating compartment provided in the front housing 3, there is a gap between the battery 4 and the first FPC 2, and the first FPC 2 is not sandwiched between the front housing 3 and the battery 4. When the battery 4 is charged by using a charging circuit including the first FPC 2, heat generated by the first FPC 2 can be dissipated through the gap between the battery 4 and the first FPC 2. The front housing 3 cannot hinder the first FPC 2 from dissipating heat. A superimposed temperature rise effect due to the heat generated by the first FPC 2 and the heat generated by the battery 4 is greatly alleviated. Thus, a temperature rise inside the mobile terminal can be effectively reduced, thereby ensuring the charging efficiency and the charging safety of the mobile terminal. In addition, the rear cover is made of a metal material. When the grounded gold surface 21 provided on the first FPC 2 is fixedly connected to the rear cover 1 by the electrically conductive and thermally conductive material, or fixedly connected to the rear cover 1 by an ultrasonic metal welding, the heat conducted to the rear cover 1 can be dissipated timely, which is conducive to the heat dissipation of the first FPC 2. Moreover, the first FPC 2 is grounded in effect, which can effectively improve concerns regarding EMI/EMC.

The above descriptions merely describe specific embodiments of the present disclosure, but the scope of the present disclosure is not limited thereto. Any modifications or substitutions that occur to those skilled in the art without departing from the spirit and principle of the disclosure shall fall within the scope of the present disclosure. Therefore, the scope of the disclosure should be defined by the scope of the claims.

What is claimed is:

1. A mobile terminal, comprising:
   a rear cover;
   a first flexible printed circuit (FPC), fixedly connected to the rear cover;
   a front housing, provided with a battery accommodation compartment, wherein in case that a battery is installed in the battery accommodation compartment, the battery is spaced apart from the first FPC;
   wherein the mobile terminal further comprises: a second FPC, wherein
   the first FPC is provided with a first connection portion and a second connection portion, the first connection portion is configured to be electrically connected to a charging cable, the second connection portion is electrically connected to a motherboard of the mobile terminal;
   the second FPC is provided with a third connection portion and a fourth connection portion, the third connection portion is electrically connected to the motherboard, and the fourth connection portion is configured to be electrically connected to the battery.

2. The mobile terminal according to claim 1, wherein the rear cover is made of a metal material.

3. The mobile terminal according to claim 2, wherein
   the first FPC is provided with a grounded gold surface, and the grounded gold surface and the rear cover are fixedly connected by an electrically conductive and thermally conductive material; or,
   the first FPC is provided with a grounded gold surface, and the grounded gold surface and the rear cover are welded by means of an ultrasonic metal welding.

4. The mobile terminal according to claim 1,
   wherein the first connection portion and the charging cable are electrically connected by a metal elastic piece and an elastic-piece-contact goldfinger that fit with each other; wherein one of the metal elastic piece and the elastic-piece-contact goldfinger is arranged on the first connection portion, and the other is arranged on the charging cable.

5. The mobile terminal according to claim 1, wherein the first FPC is provided with an interference avoidance structure configured to avoid interference with the motherboard.

6. The mobile terminal according to claim 5, wherein the interference avoidance structure is arranged at four corners of the first FPC.

7. A method of fixing a flexible printed circuit (FPC), applied to a mobile terminal comprising a first FPC and a second FPC, comprising:

obtaining the first FPC;

fixedly connecting the first FPC to a rear cover of the mobile terminal; wherein a front housing of the mobile terminal is provided with a battery accommodation compartment; in case that a battery is installed in the battery accommodation compartment, the battery is spaced apart from the first FPC;

wherein the first FPC is provided with a first connection portion and a second connection portion, the first connection portion is configured to be electrically connected to a charging cable, the second connection portion is electrically connected to a motherboard of the mobile terminal;

the second FPC is provided with a third connection portion and a fourth connection portion, the third connection portion is electrically connected to the motherboard, and the fourth connection portion is configured to be electrically connected to the battery.

8. The method according to claim 7, wherein the rear cover is made of a metal material.

9. The method according to claim 8, wherein the first FPC is provided with a grounded gold surface, and the fixedly connecting the first FPC to the rear cover of the mobile terminal comprises:

fixedly connecting the grounded gold surface to the rear cover of the mobile terminal with an electrically conductive and thermally conductive material; or, fixedly connecting the grounded gold surface to the rear cover of the mobile terminal by means of an ultrasonic metal welding.

* * * * *